United States Patent
Lee et al.

(10) Patent No.: US 10,074,314 B2
(45) Date of Patent: Sep. 11, 2018

(54) ORGANIC LIGHT-EMITTING DISPLAY DEVICE

(71) Applicant: SAMSUNG DISPLAY CO., LTD., Yongin-si, Gyeonggi-Do (KR)

(72) Inventors: Tak Young Lee, Anyang-si (KR); Chul Kyu Kang, Suwon-si (KR); Young In Hwang, Suwon-si (KR); Ji Hye Kong, Seongnam-si (KR); Deok Young Choi, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 248 days.

(21) Appl. No.: 14/861,622

(22) Filed: Sep. 22, 2015

(65) Prior Publication Data

US 2016/0300533 A1 Oct. 13, 2016

(30) Foreign Application Priority Data

Apr. 7, 2015 (KR) .......................... 10-2015-0048997

(51) Int. Cl.
*G09G 3/32* (2016.01)
*G09G 3/3266* (2016.01)
*G09G 3/3233* (2016.01)
*H01L 27/32* (2006.01)

(52) U.S. Cl.
CPC ......... *G09G 3/3266* (2013.01); *G09G 3/3233* (2013.01); *H01L 27/3279* (2013.01); *G09G 2300/0413* (2013.01); *G09G 2300/0426* (2013.01); *G09G 2320/0223* (2013.01)

(58) Field of Classification Search
CPC ... G09G 2320/0223; G09G 2300/0413; G09G 2310/00205; G09G 3/3266; G09G 3/3233
See application file for complete search history.

(56) References Cited

U.S. PATENT DOCUMENTS

| | | | |
|---|---|---|---|
| 7,535,521 B2* | 5/2009 | Kim ................. | G02F 1/136204 349/139 |
| 2009/0101912 A1* | 4/2009 | Lin ...................... | G09G 3/3648 257/71 |
| 2011/0267567 A1* | 11/2011 | Ting .................... | G02F 1/13624 349/123 |
| 2013/0168644 A1* | 7/2013 | Park .................... | H01L 51/5234 257/40 |

(Continued)

FOREIGN PATENT DOCUMENTS

| JP | 2002-108310 | 4/2002 |
|---|---|---|
| KR | 1019970066649 | 10/1997 |

(Continued)

*Primary Examiner* — Robert Michaud
(74) *Attorney, Agent, or Firm* — F. Chau & Associates, LLC

(57) ABSTRACT

An organic light-emitting display device includes a substrate having a display area and a non-display area, a thin-film transistor (TFT) that includes a gate electrode and that is disposed in the display area of the substrate, a first scan line disposed in a same layer as the gate electrode that is connected to the gate electrode; and a second scan line disposed in a different layer from the first scan line that overlaps the first scan line, wherein the first scan line is connected to the second scan line in the non-display area of the substrate.

20 Claims, 13 Drawing Sheets

(56) References Cited

U.S. PATENT DOCUMENTS

2015/0042690 A1* 2/2015 Jin ...................... H01L 27/3262
                                                                     345/690
2016/0064421 A1* 3/2016 Oh ...................... H01L 27/1222
                                                                     257/43

FOREIGN PATENT DOCUMENTS

| KR | 1020010058192 | 7/2001 |
| KR | 1020140122362 | 10/2014 |

* cited by examiner

ORGANIC LIGHT-EMITTING DISPLAY DEVICE

ORGANIC LIGHT-EMITTING DISPLAY DEVICE

This application claims priority from, and the benefit of, Korean Patent Application No. 10-2015-0048997 filed on Apr. 7, 2015 in the Korean Intellectual Property Office, the contents of which are herein incorporated by reference in their entirety.

BACKGROUND

1. Technical Field

Embodiments of the present disclosure are directed to an organic light-emitting display device.

2. Discussion of the Related Art

Organic light-emitting display devices have been increasingly viewed as next-generation display devices, and display images by using organic light-emitting diodes (OLEDs), which generate light through the recombination of electrons and holes. Organic light-emitting display devices have a fast response speed, high luminance, wide viewing angles and low power consumption.

More specifically, organic light-emitting display devices use driving transistors included in corresponding pixels to control the amount of current provided to the respective OLEDs, and each of OLED generates light with a luminance based on the amount of current provided thereto.

In addition, as the size of organic light-emitting display devices increases, the length of signal lines for transmitting signals to the pixels increases. As a result, the resistance of the signal lines and the number of parasitic components between the signal lines may also increase, which can delay the transmission of signals. Accordingly, the display quality of an organic light-emitting display device may deteriorate.

SUMMARY

Embodiments of the present disclosure can provide an organic light-emitting display device capable of providing an improved display quality by addressing resistive-capacitive (RC) delays.

According to an embodiment of the present disclosure, an organic light-emitting display device is provided. The organic light-emitting display device includes a substrate having a display area and a non-display area, a thin-film transistor (TFT) that includes a gate electrode and that is disposed in the display area of the substrate, a first scan line disposed in a same layer as the gate electrode that is connected to the gate electrode, and a second scan line disposed in a different layer from the first scan line that overlaps the first scan line. The first scan line is connected to the second scan line in the non-display area of the substrate.

A thickness of the first scan line may be greater than a thickness of the second scan line.

The first scan line may have a first end disposed in the non-display area and a second end disposed in the display area and the second scan line may be connected to the first end of the first scan line, but not to the second end of the first scan line.

A resistive-capacitive (RC) delay value of the first scan line may be less than an RC delay value of the second scan line.

The TFT may include an active layer disposed between the substrate and the gate electrode, and source and drain electrodes disposed above the gate electrode and are connected to the active layer.

The second scan line may be disposed between the first scan line and the source and drain electrodes and may shield a parasitic capacitance between the first scan line and the source and drain electrodes.

The second scan line may be disposed between the first scan line and the active layer and may shield a parasitic capacitance between the first scan line and the active layer.

The organic light-emitting display device further may include a storage capacitor that includes a lower electrode disposed on the substrate, and an upper electrode disposed on the lower electrode, wherein the lower and upper electrodes overlap each other.

According to another embodiment of the present disclosure, an organic light-emitting display device is provided. The organic light-emitting display device includes a substrate, a thin-film transistor (TFT) disposed on the substrate that includes a gate electrode, a first scan line disposed in a same layer as the gate electrode that provides a scan signal to the gate electrode, and a second scan line disposed along the same direction as the first scan line in a different layer from the first scan line and that overlaps the first scan line. The first and second scan lines are provided with a same voltage.

The substrate may include a display area in which the TFT is disposed and a non-display area which surrounds the display area, and the first scan line may be connected to the second scan line in the non-display area via at least one contact hole.

The first and second scan lines may be disposed in parallel to each other with an insulating layer disposed therebetween.

A thickness of the first scan line may be greater than a thickness of the second scan line.

A resistive-capacitive (RC) delay value of the first scan line may be less than an RC delay value of the second scan line.

The TFT may include an active layer disposed between the substrate and the gate electrode, and source and drain electrodes disposed above the gate electrode and that are connected to the active layer.

The second scan line may be disposed above the first scan line and may shield a parasitic capacitance between the first scan line and the source and drain electrodes.

The second scan line may be disposed below the first scan line and may shield a parasitic capacitance between the first scan line and the active layer.

According to another embodiment of the present disclosure, an organic light-emitting display device is provided. The organic light-emitting display device includes a data line disposed along a first direction, a first scan line disposed in a second direction that crosses the first direction and that has a branch point, a second scan line disposed along the second direction that is connected to the branch point, and a display panel that includes a pixel unit connected to the first scan line and the data line. An RC delay value of the first scan line is less than an RC delay value of the second scan line.

The pixel unit may include a switching transistor that includes a first electrode connected to the data line and a gate electrode connected to the first scan line, a driving transistor that includes a first electrode connected to a driving voltage terminal and a gate electrode connected to a second electrode of the switching transistor, a storage capacitor connected between the gate electrode and the first electrode of the driving transistor, and an organic light-emitting element connected to a second electrode of the driving transistor.

The organic light-emitting display device further may include a scan driving unit that provides a first scan signal to the pixel unit via the first scan line and a data driving unit that provides a data signal to the pixel unit via the data line.

The second scan line may be connected to the first scan line only at the branch point, and may be insulated from the first scan line.

According to embodiments of the present disclosure, each scan wire is divided into two scan lines at a lead-in part, and signals are transmitted via one of the two scan lines can minimizing a delay in the transmission of a gate signal. Thus, it is possible to improve an RC delay phenomenon. In addition, by improving the RC delay phenomenon, it is possible to improve the display quality of a display panel.

However, embodiments of the present disclosure are not restricted to those set forth herein. The above and other exemplary embodiments of the disclosure will become more apparent to those of ordinary skill in the art to which the disclosure pertains by referencing the detailed description of the disclosure given below.

DETAILED DESCRIPTION OF EXEMPLARY EMBODIMENTS

Figure 1:
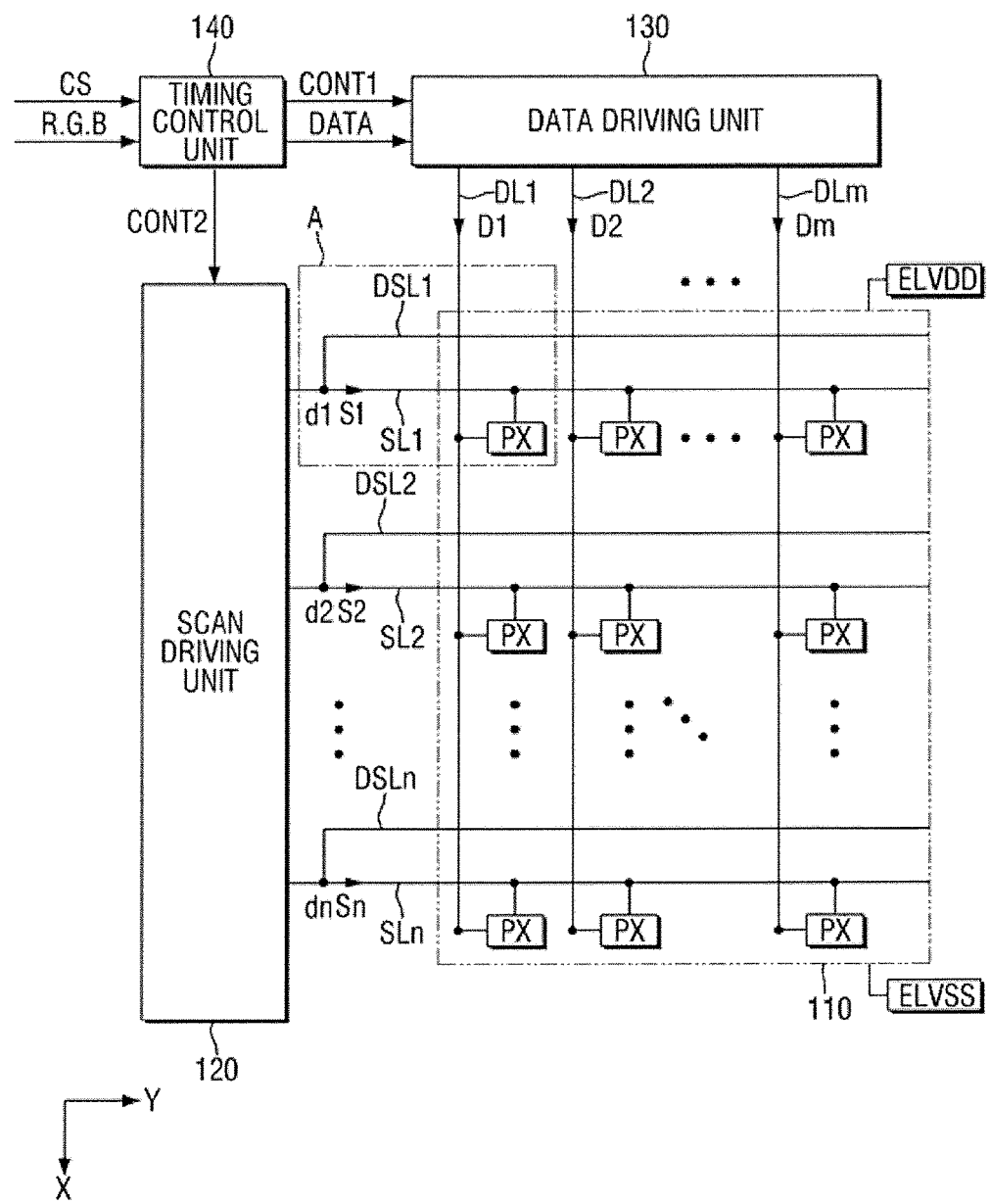
FIG. 1 is a block diagram of an organic light-emitting display device according to an embodiment of the present disclosure.

Aspects and features of the present disclosure and methods of accomplishing the same may be understood more readily by reference to the following detailed description of example embodiments and the accompanying drawings. The present disclosure may, however, be embodied in many different forms and should not be construed as being limited to the embodiments set forth herein. Similar or like reference numerals may refer to similar or like elements throughout the specification.

It will be understood that when an element or layer is referred to as being "on", "connected to", or "coupled to" another element or layer, it can be directly on, connected, or coupled to the other element or layer, or intervening elements or layers may be present. Hereinafter, embodiments of the present disclosure will be described with reference to the accompanying drawings.

FIG. 1 is a block diagram of an organic light-emitting display device according to an exemplary embodiment of the disclosure.

Referring to FIG. 1, an organic light-emitting display device may include a display panel 110, a scan driving unit 120, a data driving unit 130 and a timing control unit 140.

The display panel 110 is an area where an image is displayed. A plurality of data lines DL1 through DLm that extend in a first direction X, where m is a natural number greater than 1, are disposed on the display panel 110. A plurality of first scan lines SL1 through SLn that extend in a second direction Y, where n is a natural number greater than 1, are disposed on the display panel 110 and intersect the data lines DL1 through DLm. The first scan lines SL1 through SLn include a plurality of branch points d1 through dn, respectively. A plurality of second scan lines DSL1 through DSLn that extend in the same direction as the first scan lines SL1 through SLn, i.e., along the second direction Y, are disposed on the display panel 110. The second scan lines DSL1 through DSLn are connected to the first scan lines SL1 through SLn, respectively, via the branch points d1 through dn, respectively. The connections between the first scan lines SL1 through SLn and the second scan lines DSL1 through DSLn will be described below in detail with reference to FIG. 2. In FIG. 1, the first direction X may be a column direction, and the second direction Y may be a row direction.

The display panel 110 includes a plurality of pixel units PX connected to the data lines DL1 through DLm and the first scan lines SL1 through SLn. In an exemplary embodiment, the pixel units PX may be disposed at the intersections between the data lines DL1 through DLm and the first scan lines SL1 through SLn. The data lines DL1 through DLm, the first scan lines SL1 through SLn and the pixel units PX may be disposed on a single substrate, and the data lines DL1 through DLm and the first scan lines SL1 through SLn may be insulated from each other. In an exemplary embodiment, the data lines DL1 through DLm, the first scan lines SL1 through SLn and the pixel units PX may be disposed in a matrix pattern.

Each of the pixel units PX may be connected to one of the data lines DL1 through DLm and one of the first scan lines SL1 through SLn. The pixel units PX can be provided with a plurality of scan signals S1 through Sn from the first scan lines SL1 through SLn. The pixel units PX can be provided with a plurality of data signals D1 through Dm from the data lines DL1 through DLm. The pixel units PX are not directly connected to the second scan lines DSL1 through DSLn. When the pixel units PX are not directly connected to the second scan lines DSL1 through DSLn, no particular signals can be provided to the pixel units PX from the second scan lines DSL1 through DSLn. Accordingly, the second scan lines DSL1 through DSLn may be dummy scan lines.

Alternatively, the pixel units PX may be connected to the second scan lines DSL1 through DSLn, instead of to the first scan lines SL1 through SLn. In this example, the pixel units PX can be provided with the scan signals S1 through Sn from the second scan lines DSL1 through DSLn, and thus, the first scan lines SL1 through SLn may be dummy scan lines.

The scan lines directly connected to the pixel units PX that can provide the scan signals S1 through Sn to the pixel units PX will hereinafter be referred to as parent scan lines, and the scan lines that branch off from the parent scan lines will hereinafter be referred to as child scan lines.

The scan driving unit 120 is connected to the display panel 110 via the parent scan lines SL1 through SLn. The scan driving unit 120 can sequentially apply the scan signals S1 through Sn to the scan lines SL1 through SLn based on a control signal CONT2 provided thereto from the timing control unit 140. Accordingly, the child scan lines DSL1 through DSLn connected to the parent scan lines SL1 through SLn via the branch points d1 through dn can also be provided with the same scan signals as the parent scan lines SL1 through SLn, i.e., the scan signals S1 through Sn. That is, signals with the same voltage as those applied to the parent scan lines SL1 through SLn can be applied to the child scan lines DSL1 through DSLn. However, since the child scan lines DSL1 through DSLn are not directly connected to the pixel units PX, the child scan lines DSL1 through DSLn do not provide signals provided thereto to the pixel units PX. Each of the parent scan lines SL1 through SLn has a first end disposed in a non-display area (10 of FIG. 5) and a second end disposed in a display area (20 of FIG. 5). The child scan lines DSL1 through DSLn aree connected to the first ends of the parent scan lines SL1 through SLn, but not to the second ends of the parent scan lines SL1 through SLn.

The scan signals S1 through Sn may be provided to the pixel units PX by the scan driving unit 120, but embodiments of the disclosure are not limited thereto. That is, alternatively, the scan signals S1 through Sn may be provided to the pixel units PX from integrated circuits (ICs) and lines connected to the ICs. The scan driving unit 120 may include at least two scan drivers, and the scan signals S1 through Sn may be provided to the pixel units PX from the at least two scan drivers.

The data driving unit 130 is connected to the display panel 110 via the data lines DL1 through DLm. The data driving unit 130 can provide the data signals D1 through Dm to the data line DL1 through DLm based on a control signal CONT1 and image data DATA provided thereto from the timing control unit 140. Each of the pixel units PX includes an organic light-emitting diode (OLED) which emits light according to one of the data signals D1 through Dm provided thereto and thus displays an image.

In an exemplary embodiment, the timing control unit 140 receives a control signal CS and an image signal "R.G.B" from an external system. The control signal CS includes a vertical synchronization signal Vsync and a horizontal synchronization signal Hsync. The image signal "R.G.B" includes luminance information relating to the pixel units PX. Luminances may have 1024, 256 or 64 gray levels. The timing control unit 140 can generate image data DATA by dividing the image signal "R.G.B" into units of frames based on the vertical synchronization signal Vsync and into units of the scan lines SL1 through SLn based on the horizontal synchronization signal Hsync. The timing control unit 140 can provide the control signals CONT1 and CONT2 to the scan driving unit 120 and the data driving unit 130, respectively, based on the control signal CS and the image signal "R.G.B". More specifically, the timing control unit 140 can provide the image data DATA to the data driving unit 130 together with the control signal CONT1, and the data driving unit 130 can generate the data signals D1 through Dm by sampling and holding the image data DATA based on the control signal received from the timing control unit 140 to convert the image data DATA into one or more analog voltages.

An organic light-emitting display device also includes a power supply unit. The power supply unit may supply a driving voltage to the pixel units PX based on a control signal provided by the timing control unit 140. The power supply unit can provide a driving voltage for operating the pixel units PX through first and second power terminals ELVDD and ELVSS. In the description that follows, the first power terminal and a first driving voltage provided by the first power terminal may both be referred to by ELVDD, and the second power terminal and a second driving voltage provided by the second power terminal may both be referred to by ELVSS.

Figure 2:
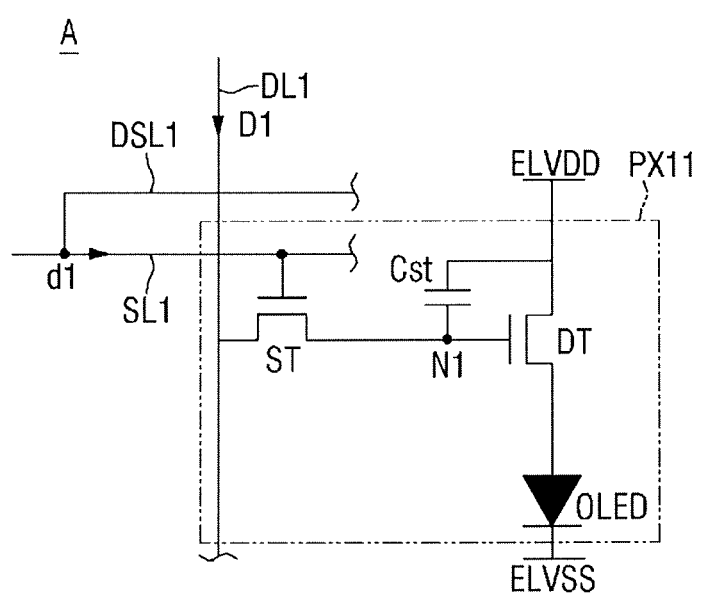
FIG. 2 is a circuit diagram of area A in FIG. 1.

FIG. 2 is a circuit diagram of area A of FIG. 1. More specifically, FIG. 2 illustrates a pixel unit PX11 to which the first scan line SL1 is directly connected. The first scan line SL1 will hereinafter be referred to as a first parent scan line SL1. Referring to FIG. 2, a determination can be made as to which scan line is connected to the gate electrode of a switching transistor ST based on the resistance of each scan line and the capacitance of a parasitic component between each scan line and another line. More specifically, the gate electrode of the switching transistor ST is connected to a scan line with a relatively low resistive-capacitive (RC) delay, i.e., a scan line with low resistance and small parasitic capacitance.

The resistance of the first parent scan line SL1 may be lower than the resistance of the first child scan line DSL1, and the parasitic capacitance between the first parent scan line SL1 and another line may be lower than the parasitic capacitance between the second parent scan line SL2 and another line, which will be described below in further detail with reference to FIGS. 3 to 5.

The pixel unit PX11 in area A is a pixel unit connected to the first parent scan line SL1 and the first data line DL1, and other pixel units PX have a structure similar to that of pixel unit PX11. However, the pixel units PX are not limited to the structure of the pixel unit PX11 as illustrated in FIG. 2.

Referring to FIG. 2, pixel unit PX11 includes the switching transistor ST, a driving transistor DT, a storage capacitor Cst and an OLED "OLED".

The switching transistor ST has a first electrode connected to the first data line DL1, a second electrode connected to a first node N1, and a gate electrode connected to the first parent scan line SL1. The switching transistor ST can be turned on by a low-level first scan signal S1 applied to the first parent scan line SL1, and can provide the first data signal D1 received from the first data line DL1 to the first node N1. The switching transistor ST may be a p-channel field effect transistor (FET). That is, the switching transistor ST may be turned on by a low-level scan signal and may be turned off by a high-level scan signal. The switching transistor ST and the driving transistor DT may both be p-channel FETs, but embodiments of the disclosure are not limited thereto. That is, alternatively, the switching transistor ST and the driving transistor DT may both be n-channel FETs.

The switching transistor ST can be provided with a scan signal from the first parent scan line SL1, which is connected to the gate electrode of the switching transistor ST, but switching transistor ST is not be connected to the first child scan line DSL1.

The driving transistor DT has a first electrode connected to the first power terminal ELVDD, a second electrode connected to the OLED "OLED", and a gate electrode connected to the first node N1. The driving transistor DT can control the amount of current provided to the second power terminal ELVSS through the OLED "OLED" from the first power terminal ELVDD based on voltage applied to the first node N1.

The storage capacitor Cst has a first terminal connected to the first node N1 and a second terminal connected to the first electrode of the driving transistor DT. The OLED "OLED" includes an anode electrode connected to the second electrode of the driving transistor DT, a cathode electrode connected to the second power terminal ELVSS, and an organic light-emitting layer. The organic light-emitting layer can emit light of one of a plurality of primary colors, and the primary colors may include red, green and blue. A desired color can be rendered by a spatial or temporal sum of the primary colors. The organic light-emitting layer may include a low- or high-molecular organic material that corresponds to each color. The low- or high-molecular organic material can emit light based on the amount of current flowing in the organic light-emitting layer.

Figure 3:
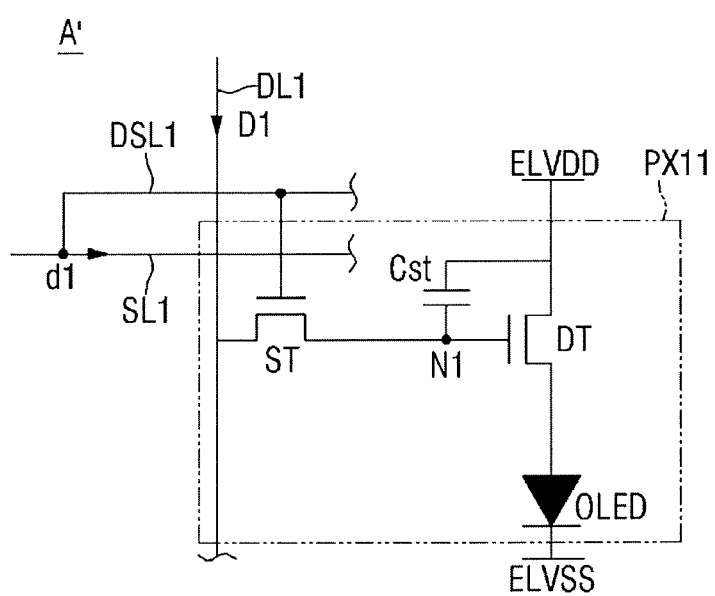
FIG. 3 is a circuit diagram of a variation of area A in FIG. 1, i.e., area A'.

FIG. 3 is a circuit diagram of a variation of area A of FIG. 1, i.e., area A'. Referring to FIG. 3, the gate electrode of the switching transistor ST may be connected to the first child scan line DSL1, which branches off from the first branch point d1. That is, in the example of FIG. 3, unlike the example of FIG. 2, the first child scan line DSL1 branched off from the first branch point d1 of the first parent scan line SL1 is connected to the gate electrode of the switching transistor ST, and thus, the gate electrode of the switching transistor ST can be provided with a scan signal through the first child scan line DSL1. On the other hand, since the first parent scan line SL1 is not directly connected to the gate electrode of the switching transistor ST, the first parent scan line SL1 may be a dummy scan line. That is, the structure of the pixel unit PX11 of FIG. 2 and the structure of the pixel unit PX11 of FIG. 3 are substantially similar, except for whether the gate electrode of the switching transistor ST is connected to the first parent scan line SL1 or the first child scan line DSL1. Factors that play a role in determining which scan line is to be connected to the gate electrode of the switching transistor ST will hereinafter be described with reference to FIGS. 4 and 5.

Figure 4:
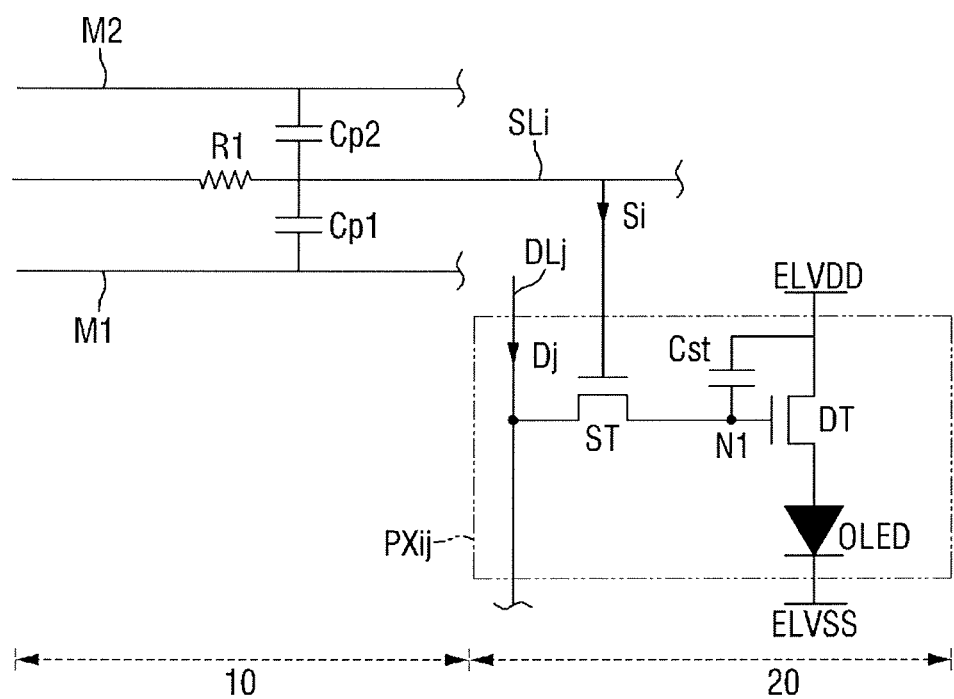
FIGS. 4 and 5 are equivalent circuit diagrams that illustrate an operation of an organic light-emitting display device according to an embodiment of the present disclosure.
Figure 5:
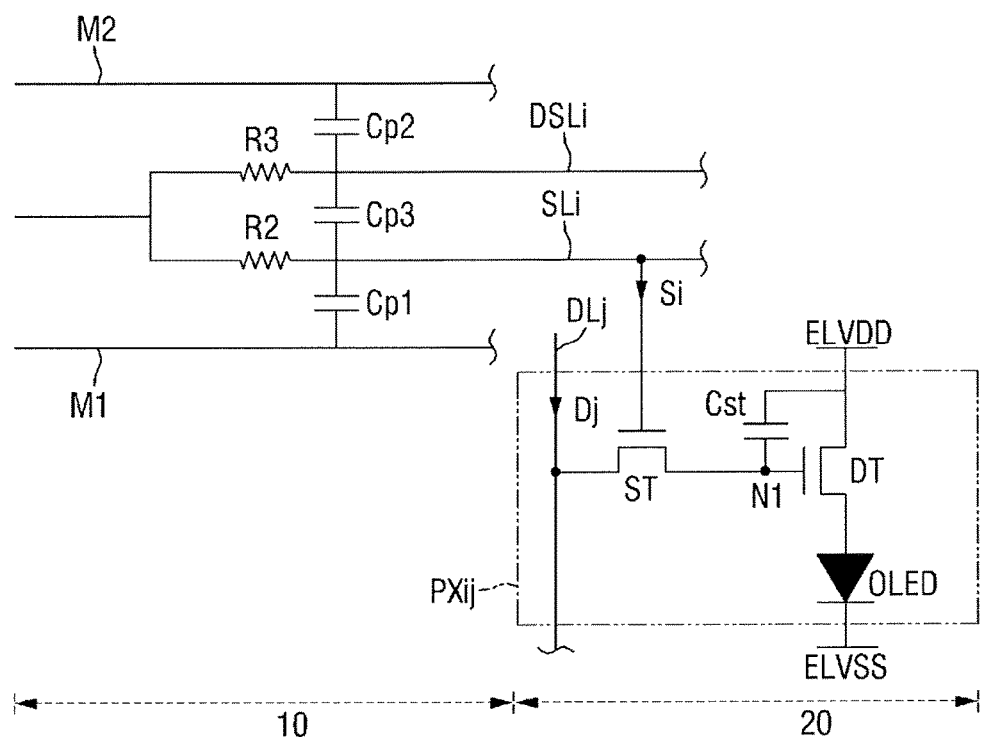

FIGS. 4 and 5 are equivalent circuit diagrams that illustrate an operation of an organic light-emitting display device according to an exemplary embodiment of FIG. 1. More specifically, FIG. 4 illustrates the occurrence of an RC delay in a conventional organic light-emitting display device, and FIG. 5 illustrates the reduction of an RC delay by an organic light-emitting display device according to an exemplary embodiment of FIG. 1. FIGS. 4 and 5 illustrate a pixel unit PXij provided with an i-th scan signal Si and a j-th data signal Dj, as an example of the pixel units PX. FIGS. 4 and 5 depict a non-display area 10 where no pixel units PX are provided, and in which no image is displayed, and a display area 20 where the pixel units PX are provided and an image is displayed.

Referring to FIG. 4, a conventional organic light-emitting display device may include an i-th scan line SLi disposed on a substrate that extends from the non-display area 10 to the display area 20. The conventional organic light-emitting display device may also include a first line M1 and a second line M2. The first line M1 may be any line disposed below the i-th scan line SLi on the substrate, and the second line M2 may be any line disposed above the i-th scan line SLi on the substrate. That is, the first and second lines M1 and M2 and the i-th scan line SLi may be disposed in different layers of the substrate, and may be insulated from one another by, for example, an insulating layer.

A parasitic capacitance Cp1 may be generated between the i-th scan line SLi and the first line M1, and a parasitic capacitance Cp2 may be generated between the i-th scan line SLi and the second line M2. The first scan line SLi may have a resistance R1 due to its width and thickness. Accordingly, when the i-th scan signal Si is applied, a signal delay may occur in the i-th scan line SLi due to an RC delay value determined by the resistance R1 and the parasitic capacitances Cp1 and Cp2. The RC delay value determined by the resistance R1 and the parasitic capacitances Cp1 and Cp2 may be defined as a reference RC delay value. A relatively large RC delay can occur in a pixel unit PXim connected to the m-th data line DLm where the pixel unit PXim is most distant from the start of the i-th scan signal Si. Accordingly, the switching transistor ST of the pixel unit PXim does not obtain a sufficient required voltage from the i-th scan signal Si, and may thus cause a data charge/discharge deviation. As a result, the luminance of the entire display panel of the conventional organic light-emitting display device may become irregular.

Referring to FIG. 5, an organic light-emitting display device according to an exemplary embodiment of FIG. 1 includes an i-th parent scan line SLi which extends from the non-display area 10 to the display area 20, is connected to the pixel unit PXij, and includes an i-th branch point di. An organic light-emitting display device according to an exemplary embodiment of FIG. 1 also includes an i-th child scan line DSLi branched off from the i-th branch point di of the i-th parent scan line SLi and that extends in the same direction as the i-th parent scan line SLi. The i-th parent scan line SLi and the i-th child scan line DSLi may be disposed in different layers of a substrate, and may be connected to each other at the i-th branch point di. The arrangement of the i-th parent scan line SLi and the i-th child scan line DSLi will be described below in further detail with reference to FIGS. 7 to 13.

The arrangement of the i-th parent scan line SLi and the i-th child scan line DSLi is not particularly limited as long as the i-th parent scan line SLi and the i-th child scan line DSLi are disposed in different layers from each other. For example, the i-th parent scan line SLi may be disposed below the i-th child scan line DSLi, as illustrated in FIG. 5. The first line M1 may be disposed below the i-th parent scan line SLi, and the i-th parent scan line SLi may be disposed between the first line M1 and the i-th child scan line DSLi. The second line M2 may be disposed above the i-th child scan line DSLi, and the i-th child scan line DSLi may be disposed between the i-th parent scan line SLi and the second line M2. The i-th parent scan line SLi, the i-th child scan line DSLi, the first line M1 and the second line M2 may be disposed in different layers of the substrate, and the different layers of the substrate may be insulated from one another by, for example, an insulating layer.

From the viewpoint of the i-th parent scan line SLi, a parasitic capacitance Cp1 may be generated between the i-th parent scan line SLi and the first line M1 disposed below the i-th parent scan line SLi, and a parasitic capacitance Cp3 may be generated between the i-th parent scan line SLi and the i-th child scan line DSLi disposed above the i-th parent scan line SLi. The i-th parent scan line SLi may have a resistance R2. From the viewpoint of the i-th child scan line DSLi, the parasitic capacitance Cp3 may be generated between the i-th child scan line DSLi and the i-th parent scan line SLi disposed below the i-th child scan line DSLi, and a parasitic component Cp2 may be generated between the i-th child scan line DSLi and the second line M2 disposed above the i-th child scan line DSLi. The i-th child scan line DSLi may have a resistance R3. In the description that follows, it is assumed that the capacitance of the parasitic capacitance Cp1 between the i-th parent scan line SLi and the first line M1 is less than the the parasitic capacitance Cp2 between the i-th child scan line is DSLi and the second line M2.

The i-th parent scan line SLi has a first RC delay value (320 of FIG. 6) determined by the resistance R2 and the parasitic capacitances Cp1 and Cp3, and the i-th child scan line DSLi has a second RC delay value (340 of FIG. 6) determined by the resistance R3 and the parasitic capacitances Cp2 and Cp3.

Since the i-th scan signal Si is applied to both the i-th parent scan line SLi and the i-th child scan line DSLi, a voltage difference ΔV between the i-th parent scan line SLi and the i-th child scan line DSLi is essentially zero, but not exactly zero due to the resistances of the i-th parent scan line SLi and the i-th child scan line DSLi, and if there is no voltage difference between i-th parent scan line SLi and the i-th child scan line DSLi, the parasitic capacitance Cp3 will not be generated. Accordingly, the total charge of the parasitic capacitance Cp3 between the i-th parent scan line SLi and the i-th child scan line DSLi may decrease. Therefore, the parasitic capacitance Cp3 may be less than the parasitic capacitances Cp1 and Cp2.

Since the parasitic capacitance Cp1 between the i-th parent scan line SLi and the first line M1 is less than the parasitic capacitance Cp2 between the i-th child scan line DSLi and the second line M2, the i-th parent scan line SLi may be thicker than the i-th child scan line DSLi. Accordingly, the resistance of the i-th parent scan line SLi, i.e., the resistance R2, may be less than the resistance of the i-th child scan line DSLi, i.e., the resistance R3.

That is, the parasitic capacitance Cp1 between the i-th parent scan line SLi and the first line M1 is less than the parasitic capacitance Cp2 between the i-th child scan line DSLi and the second line M2, and the resistance R2 of the i-th parent scan line SLi is less than the resistance R3 of the i-th child scan line DSLi. Accordingly, the first RC delay value (320 of FIG. 6) determined by the resistance R2 of the i-th parent scan line SLi and the parasitic capacitances Cp1 and Cp3, may be less than the second RC delay value (340 of FIG. 6) determined by the resistance R3 of the i-th child scan line DSLi and the parasitic capacitances Cp2 and Cp3.

Due to a coupling of the i-th parent scan line SLi and the i-th child scan line DSLi by the parasitic capacitance Cp3, an additional RC delay may be reduced.

If the parasitic capacitance Cp1 is greater than the parasitic capacitance Cp2, the i-th parent scan line SLi may be thinner than the i-th child scan line DSLi so that the resistance R2 of the i-th parent scan line SLi is greater than the resistance R3 of the i-th child scan line DSLi. In this case, the second RC delay value (340 of FIG. 6) is greater than the first RC delay value (320 of FIG. 6). Accordingly, the gate electrode of the switching transistor ST of the pixel unit PXij is connected to the i-th child scan line DSLi. That is, the i-th parent scan line SLi may be a dummy scan line.

Referring to FIGS. 4 and 5, the first RC delay value (320 of FIG. 6) is less than the RC delay value of the i-th scan line SLi of FIG. 4, i.e., the reference RC delay value (330 of FIG. 6), because the parasitic capacitance Cp3 between the i-th parent scan line SLi and the i-th child scan line DSLi of FIG. 5 is less than the parasitic capacitance Cp2 between the i-th scan line SLi and the second line M2 of FIG. 4, and the resistance R2 of the i-th parent scan line SLi of FIG. 5 is less than the resistance R1 of the i-th scan line SLi of FIG. 4. Accordingly, the pixel unit PXij, in particular the gate electrode of the switching transistor ST of the pixel unit PXij, may be connected to the i-th parent scan line SLi with the lower RC delay value and may thus be provided with the i-th scan signal Si through the i-th parent scan line SLi.

Figure 6:
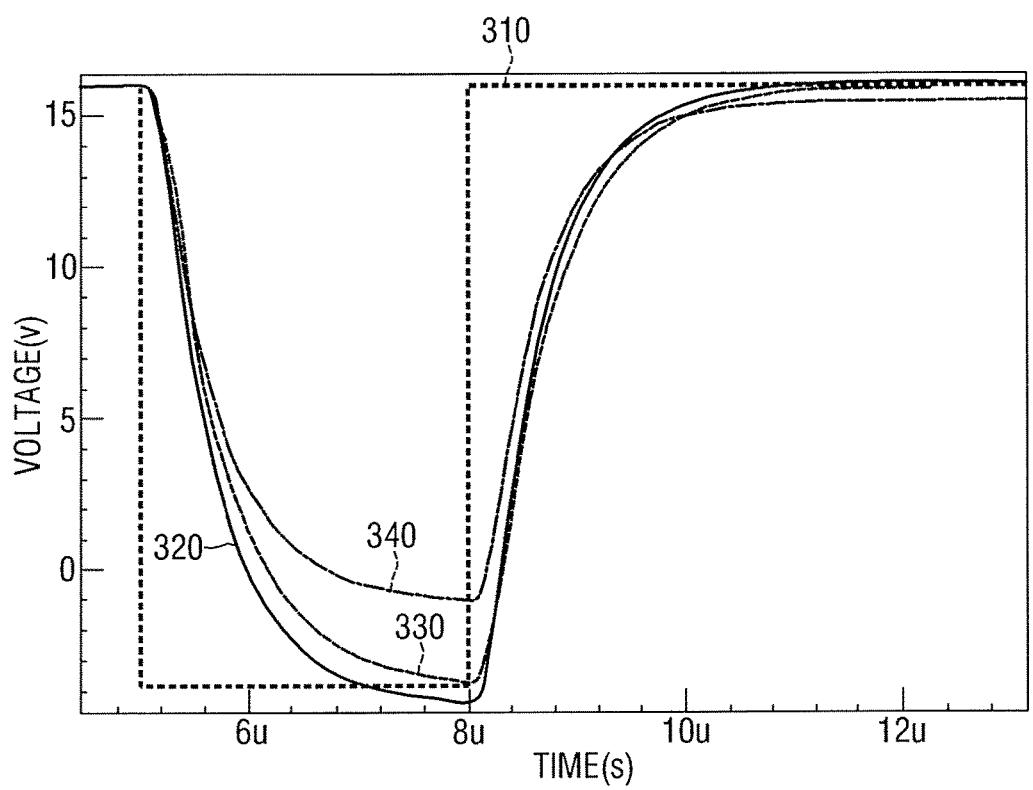
FIG. 6 is a graph showing resistive-capacitive (RC) delays in an organic light-emitting display device according to an embodiment of the present disclosure.

Since the resistance R3 of the i-th child scan line DSLi is greater than the resistance R1 of the i-th scan line SLi of FIG. 4, the second RC delay value (340 of FIG. 6) is greater than the reference RC delay value (330 of FIG. 6). That is, among the three RC delay values, i.e., the reference RC delay value (330 of FIG. 6), the first RC delay value (320 of FIG. 6) and the second RC delay value (340 of FIG. 6), the first RC delay value (320 of FIG. 6) is the smallest and the second RC delay value (340 of FIG. 6) is the largest. Accordingly, a signal delay may be smaller in the i-th parent scan line SLi than in the i-th scan line SLi of FIG. 4 and the i-th child scan line DSLi.

According to an exemplary embodiment of FIG. 1, between two scan lines that branch off from the non-display area 10, one of the two scan lines with a low parasitic capacitance may be thicker than the other scan line and thus to have a lower resistance than the other scan line, thereby resulting in a difference between the RC delay values of the two scan lines. Then, the scan line with the lesser RC delay value may be connected to the gate electrode of the switching transistor ST of a pixel unit, thereby improving an RC delay. Accordingly, a data charge/discharge deviation can be reduced even in a high-resolution/large-scale organic light-emitting display device, which can prevent luminance irregularity of the entire display panel of an organic light-emitting display device.

If the i-th parent scan line SLi and the i-th child scan line DSLi are connected to each other in an area other than the non-display area 10, such as the display area 20, the i-th parent scan line SLi and the i-th child scan line DSLi may become nodes in the display area 10 that are electrically connected. Accordingly, the i-th child scan line DSLi may not be able to block the parasitic capacitance between the i-th parent scan line SLi and the second line M2, and the i-th parent scan line SLi may not be able to block the parasitic capacitance between the i-th child scan line DSLi and the first line M1. As a result, each parasitic capacitance is relatively high, and thus, a relatively large signal delay may occur.

Therefore, in an organic light-emitting display device according to an exemplary embodiment of FIG. 1, the i-th parent scan line SLi and the i-th child scan line DSLi is connected in the non-display area 10 and be insulated from each other elsewhere.

Figure 8:
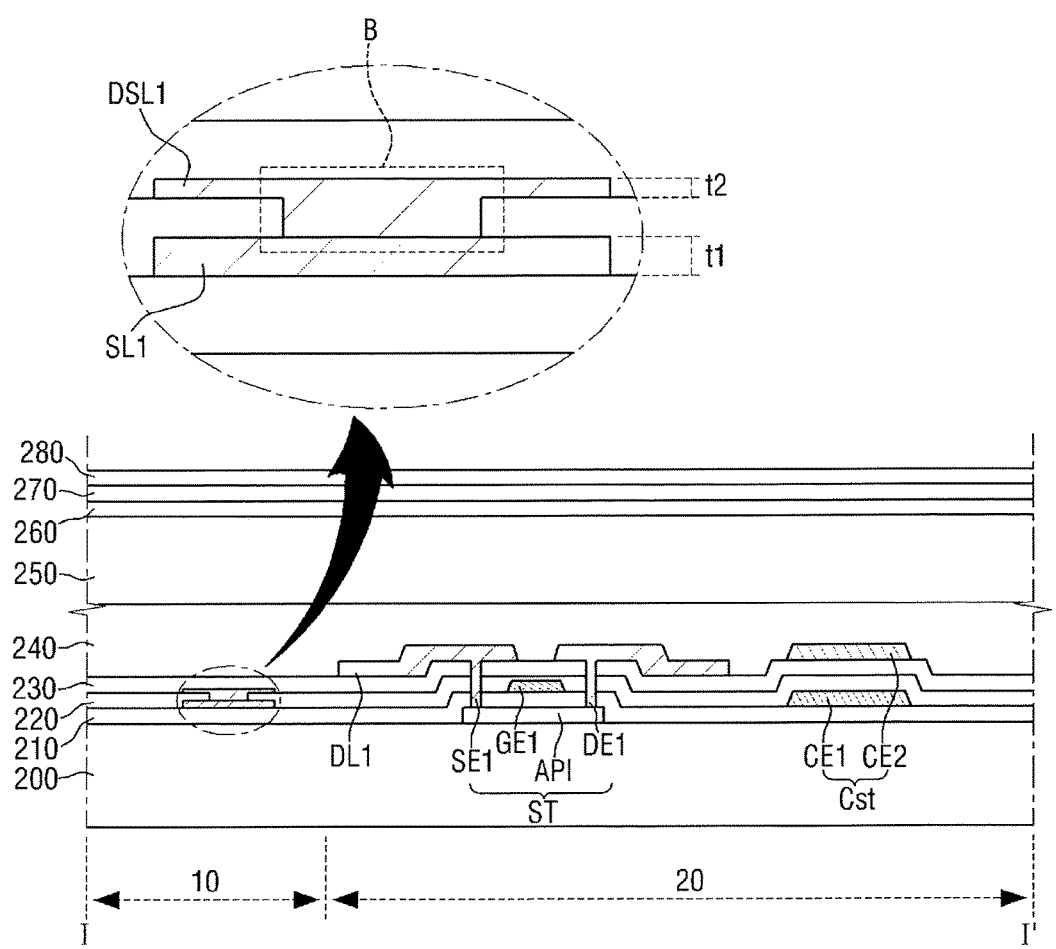
FIG. 8 is a cross-sectional view taken along line I-I' of FIG. 7.

The first line M1 may be an active layer (AP1 of FIG. 8) disposed below the gate electrode of the switching transistor ST of the pixel unit PXij, and the second line M2 may be a source or drain electrode (SE1 or DE1 of FIG. 8 disposed above the gate electrode of the switching transistor ST of the pixel unit PXij.

FIG. 6 is a voltage-time (V-T) graph showing RC delays in an organic light-emitting display device according to an exemplary embodiment of FIG. 1. Referring to FIG. 6, reference numerals 310, 320, 330 and 340 represent an input waveform, a first RC delay value, a reference RC delay value and a second RC delay value, respectively.

As described above with reference to FIGS. 4 and 5, the RC delay values 320, 330 and 340 may differ from one another. The first RC delay value 320, which is determined by the resistance R2 of the i-th parent scan line SLi and the parasitic capacitances Cp1 and Cp3, may be less than the second RC delay value 340, which is determined by the resistance R3 of the i-th child scan line DSLi and the parasitic capacitances Cp2 and Cp3, and the reference delay value 330, and this will hereinafter be described in further detail with reference to FIGS. 7 to 10.

Figure 7:
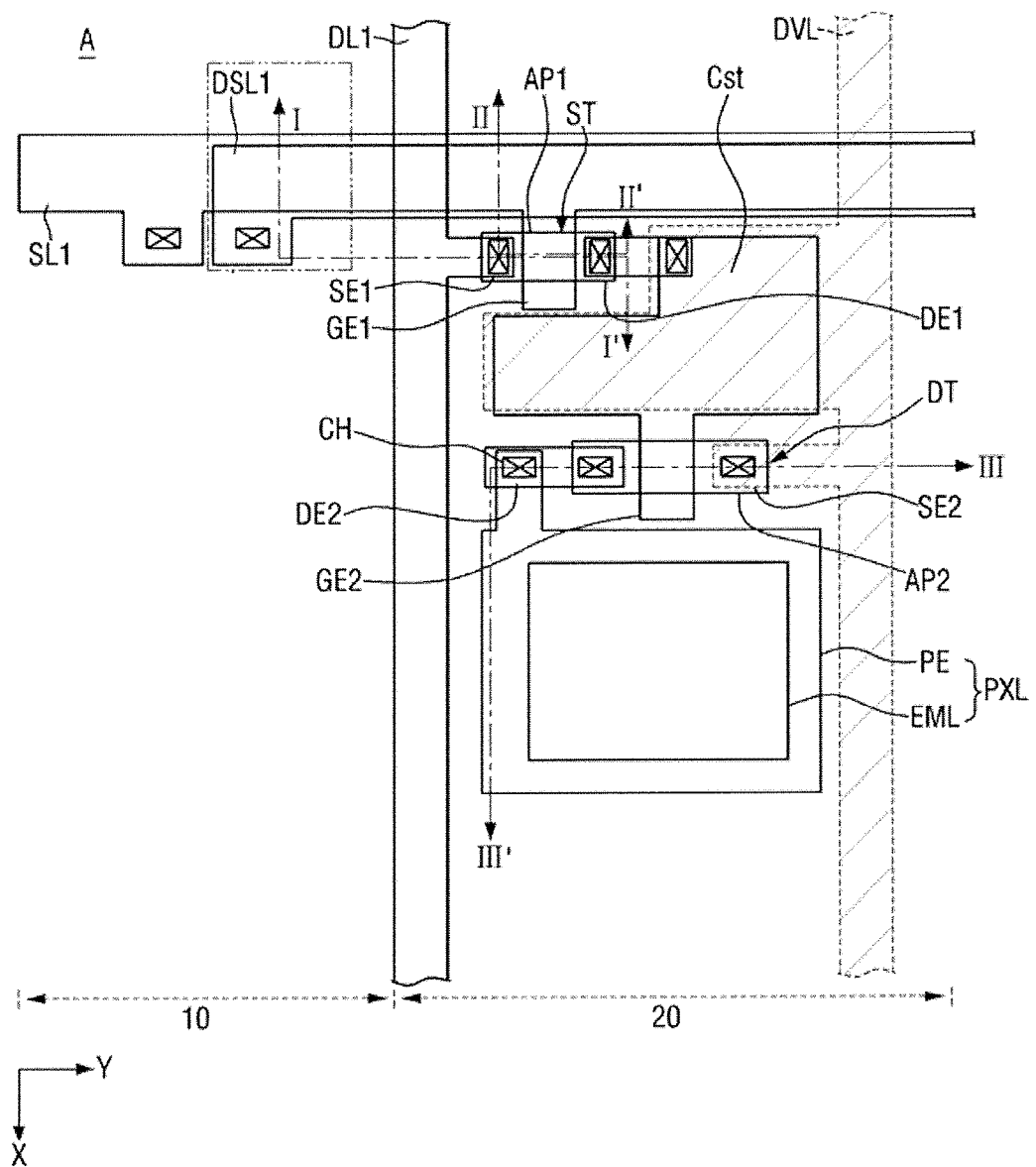
FIG. 7 is a plan view of area A of FIG. 1.
Figure 9:
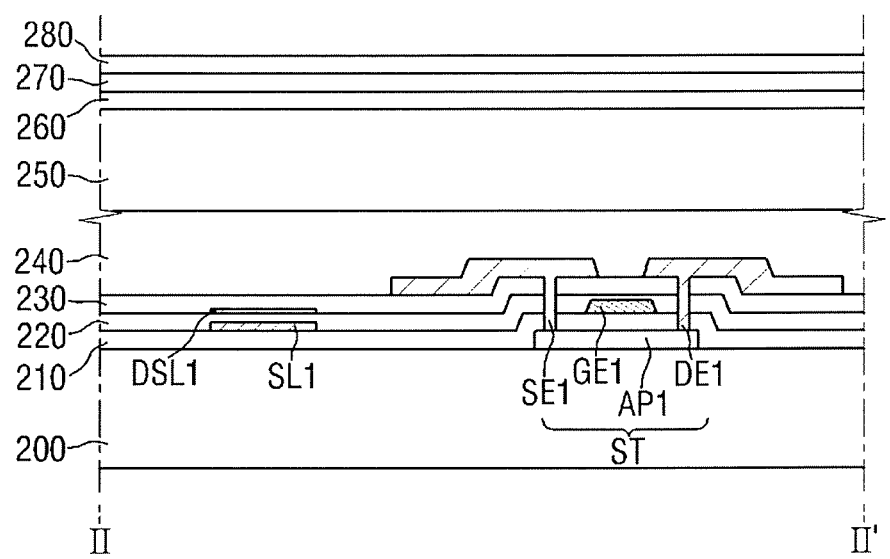
FIG. 9 is a cross-sectional view taken along line II-II' of FIG. 7.
Figure 10:
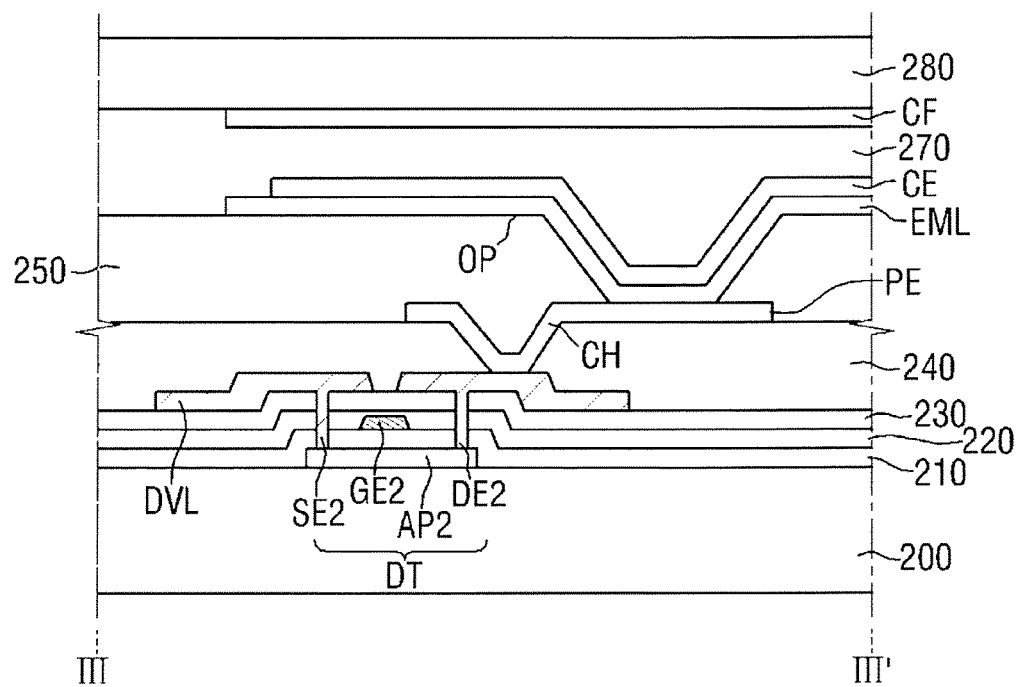
FIG. 10 is a cross-sectional view taken along line III-III' of FIG. 7.

FIG. 7 is a plan view of area A of FIG. 1. FIG. 8 is a cross-sectional view taken along line I-I' of FIG. 7. FIG. 9 is a cross-sectional view taken along line II-II' of FIG. 7. FIG. 10 is a cross-sectional view taken along line III-III' of FIG. 7.

Referring to FIGS. 7 to 10, an organic light-emitting display device according to an exemplary embodiment of FIG. 1 includes a lower substrate 200, an upper substrate 280, a first parent scan line SL1, a first child scan line DSL1, a first data line DL1, a driving power line DVL, a switching transistor ST, a driving transistor DT and a storage capacitor Cst.

The lower substrate 200 may be bonded to the upper substrate 280 through sealing. In an exemplary embodiment, the lower substrate 200 may be a glass substrate, a plastic substrate or a low-temperature polysilicon (LTPS) substrate. The upper substrate 280 is disposed to face the lower substrate 200, and the lower substrate 200 and the upper substrate is 280 may be bonded together by a sealing member disposed along the sides of the lower substrate 200 and the upper substrate 280. In an exemplary embodiment, the upper substrate 280 may be a glass substrate, a plastic substrate or a stainless use steel (SUS) substrate. In another exemplary embodiment, the lower substrate 200 and the upper substrate 280 may be flexible metal substrates.

The lower substrate 200 includes a non-display area 10 and a display area 20. The first data line DL1 and the driving power line DVL extend in the first direction X, and the first parent scan line SL1 and the first child scan line DSL1 extend in a direction from the non-display area 10 to the display area 20, i.e., the second direction Y. The switching transistor ST, the driving transistor DT and the storage capacitor Cst are all be disposed in the display area 20. The sealing member is disposed in the non-display area 10 outside the display area 20, and can bond the lower substrate 200 and the upper substrate 280 together.

The first parent scan line SL1 and the first child scan line DSL1 are disposed in different layers to overlap each other in a vertical direction. In an exemplary embodiment, the first parent scan line SL1 may be disposed below the first child scan line DSL1. Referring to FIG. 8, a second insulating layer 220 may be interposed between the first parent scan line SL1 and the first child scan line DSL1, and the first parent scan line SL1 and the first child scan line DSL1 are electrically connected to each other in the non-display area 10 via at least one contact hole B.

On the other hand, referring to FIG. 9, the first parent scan line SL1 and the first child scan line DSL1 are insulated from each other in the display area 20. In an exemplary embodiment, the second insulating layer 220 may be interposed between the first parent scan line SL1 and the first child scan line DSL1. Accordingly, the first parent scan line SL1 and the first child scan line DSL1 are electrically connected to each other in the branch part B in the non-display area 10, but not elsewhere.

Referring back to FIG. 8, the first parent scan line SL1 is electrically connected to a gate electrode GE1 of the switching transistor ST and can provide the first scan signal S1 to the gate electrode GE1 of the switching transistor ST. As described above, when the first parent scan line SL1 is electrically connected to the gate electrode GE1 of the switching transistor ST, the first child scan line DSL1 is a dummy scan line. A thickness t1 of the first parent scan line SL1 is greater than a thickness t2 of the first child scan line DSL1, and as a result, the resistance of the first parent scan line SL1 is less than the resistance of the first child scan line DSL1. In an exemplary embodiment, the thickness t1 of the first parent scan line SL1 may be about 9 KÅ, and the thickness t2 of the first child scan line DSL1 may be about 1 KÅ. That is, the first parent scan line SL1 to which the gate electrode GE1 of the switching transistor ST is electrically connected has a relatively low RC delay value.

The switching transistor ST includes the gate electrode GE1, a source electrode SE1, a drain electrode DE1 and an active layer AP1. The switching transistor ST is electrically connected to the first data line DL1 via the source electrode SE1, and can receive the first data signal D1 from the first data line DL1. The switching transistor ST is electrically connected to the first parent scan line SL1 via the gate electrode GE1, and can receive the first scan signal S1 via the first parent scan line SL1. That is, the gate electrode GE1 of the switching transistor ST and the first parent scan line SL1 may be disposed in the same layer of the lower substrate 200. The active layer AP1 is disposed on the lower substrate 200, and includes a semiconductor material. The active layer AP1 may include amorphous silicon or crystalline silicon, but embodiments of the disclosure are not limited thereto. In addition, the active layer AP1 may include source and drain regions where the active layer AP1 contacts the source and drain electrodes SE1 and DE1, and may also include a channel region disposed between the source and drain regions. That is, the source and drain electrodes SE1 and DE1 contact the active layer AP1 via contact holes formed through a first insulating layer 210 and the second insulating layer 220. Accordingly, the gate electrode GE1 of the switching transistor ST can be turned on by receiving the first scan signal S1 via the first parent scan signal SL1, and the drain electrode DE1 can then provide the first data signal D1 received from the first data line DL1 to the storage capacitor Cst and the driving transistor DT.

The gate electrode GE1 of the switching transistor ST may include a first conductive material, and the first parent scan line SL1 may include a second conductive material with a lower specific resistance than the first conductive material. For example, the first conductive material may include molybdenum (Mo), aluminum (Al), nickel (Ni), an alloy of Al, or an alloy of at least two of Mo, Al and Ni, and the second conductive material may include copper (Cu). Accordingly, a delay in the flow of a scan signal due to the resistance of the first parent scan line SL1 can be minimized even if the first parent scan line SL1 has a line shape.

In an exemplary embodiment, the switching transistor ST can be transformed into a conductor by introducing hydrogen into the source and drain regions of the active layer AP1 through thermal treatment. That is, by transforming part of the active layer AP1 into a conductor through thermal treatment, the switching transistor ST can form a stable top-gate thin-film transistor (TFT) even if an oxide semiconductor is used as the active layer AP1. Accordingly, an organic light-emitting display device according to an exemplary embodiment of FIG. 1 can be configured to have a low parasitic capacitance, a high aperture ratio and stable characteristics.

Since the first child scan line DSL1 is disposed above the gate electrode GE1 of the switching transistor ST, the first child scan line DSL1 can shield the gate electrode GE1 of the switching transistor ST. More specifically, the source and drain electrodes SE1 and DE1 can be disposed above the gate electrode GE1, in which case, a parasitic capacitance can be generated between the gate electrode GE1 and the source and drain electrodes SE1 and DE1. Since the first child scan line DSL1 is disposed above, and thus shields, the gate electrode GE1, a parasitic capacitance can be generated between the gate electrode GE1 and the first child scan line DSL1. Since there is little voltage difference ΔV between a voltage applied to the first parent scan line SL1 and a voltage applied to the first child scan line DSL1, the total charge of the parasitic capacitance between the gate electrode GE1 and the first child scan line DSL1 decreases, and as a result, the parasitic capacitance between the gate electrode GE1 and the first child scan line DSL1 less than the parasitic capacitance between the gate electrode GE1 and the source and drain electrodes SE1 and DE1.

As described above, the first parent scan line SL1 to which the gate electrode GE1 of the switching transistor ST is connected has a relatively low resistance. Accordingly, an RC delay value, which is determined by the resistance R2 of the first parent scan line SL1, a parasitic capacitance Cp1 between the gate electrode GE1 and the active layer AP1, and a parasitic the first parent scan line SL1 Cp3 between the gate electrode GE1 and the first child scan line DSL1, is reduced, thereby improving a signal delay phenomena.

The storage capacitor Cst includes a lower electrode CE1 and an upper electrode CE2. The lower electrode CE1 and the upper electrode CE2 may have one or more insulating layers interposed therebetween. In an exemplary embodiment, a third insulating layer 230 and the second insulating layer 220 may be interposed between the lower electrode CE1 and the upper electrode CE2, as illustrated in FIG. 8. The storage capacitor Cst is electrically connected to the switching transistor ST and the driving power line DVL. The storage capacitor Cst can be charged with a voltage corresponding to a difference between a voltage of the first data signal D1 received from the switching transistor ST, and a driving voltage ELVDD received from the driving power line DVL. The driving transistor DT can receive the voltage of the storage capacitor Cst when the switching transistor ST is turned off.

Referring to FIG. 10, the driving transistor DT includes a gate electrode GE2, a source electrode SE2, a drain electrode DE2 and an active layer AP2. The driving transistor DT is electrically connected to the switching transistor ST, the driving power line DVL and a pixel PXL. The driving transistor DT can switch a power signal received from the driving power line DVL to the pixel PXL.

The pixel PXL includes a pixel electrode PE, a common electrode CE and an organic light-emitting layer EML. In an exemplary embodiment, the pixel electrode PE may be an anode electrode, and the common electrode CE may be a cathode electrode. The pixel electrode PE is disposed on a planarization layer 240, which covers the driving transistor DT and the switching transistor ST. The pixel electrode PE is electrically connected to the drain electrode DE2 of the driving transistor DT via a contact hole CH, which is formed in the planarization layer 240. A pixel-defining layer with an opening OP formed therein is disposed on the pixel electrode PE. The organic light-emitting layer EML contacts the pixel electrode PE via the opening OP. The common electrode CE is disposed on the organic light-emitting layer EML, and a common voltage can be applied to the common electrode CE. Accordingly, electrons provided by the common electrode CE and holes provided by the pixel electrodes PE recombine with each other in the organic light-emitting layer EML, and as a result, the organic light-emitting layer EML can emit light.

The upper substrate 280 can be coupled to the lower substrate 200 with a cover layer 270 disposed therebetween, and the cover layer 270 can protect the pixel PXL from any moisture and gas introduced thereinto from outside. A color filter CF may be disposed on the upper substrate 280. The color filter CF can filter white light emitted from the organic light-emitting layer EML, thereby providing color. In some exemplary embodiments, the color filter CF may be omitted, in which case, the organic light-emitting layer EML can emit color light.

Figure 11:
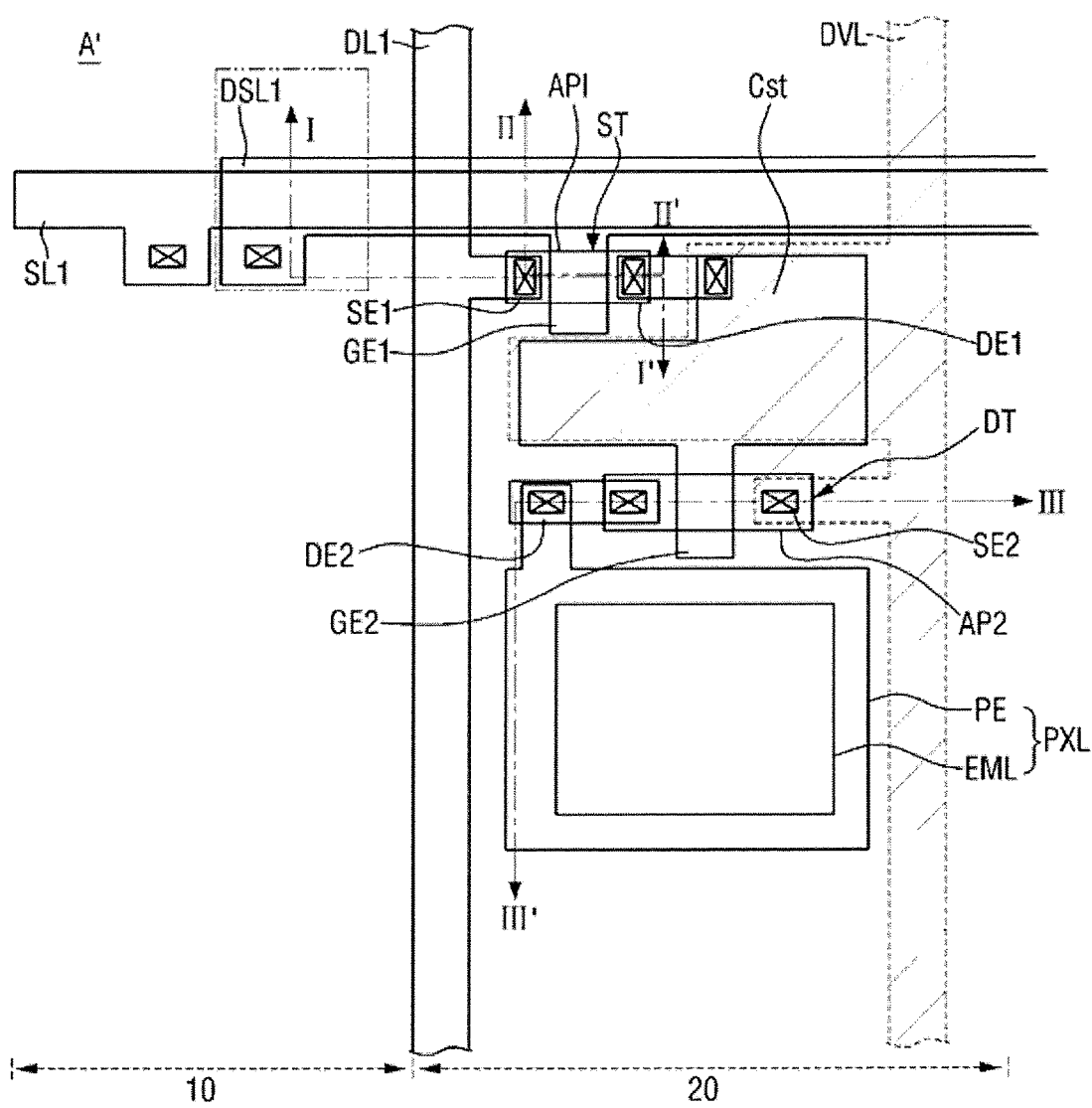
FIG. 11 is a plan view of area A' of FIG. 3.
Figure 12:
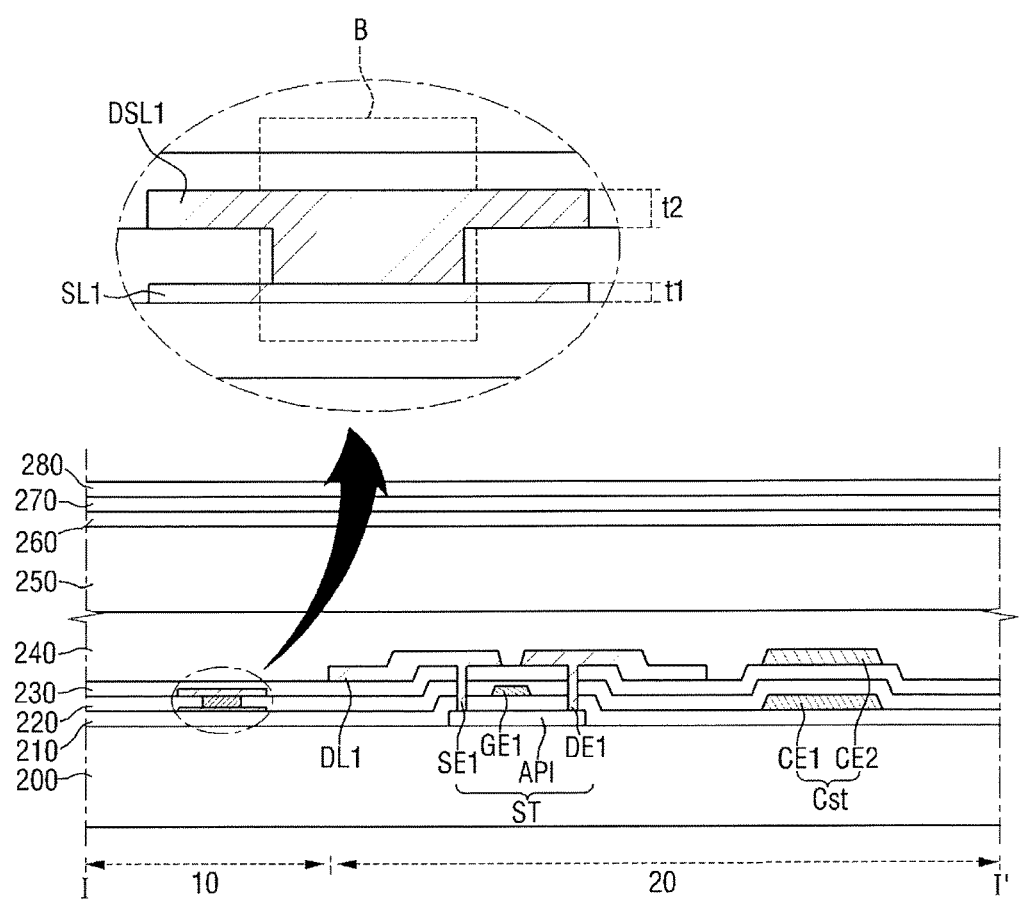
FIG. 12 is a cross-sectional view taken along line I-I' of FIG. 11.
Figure 13:
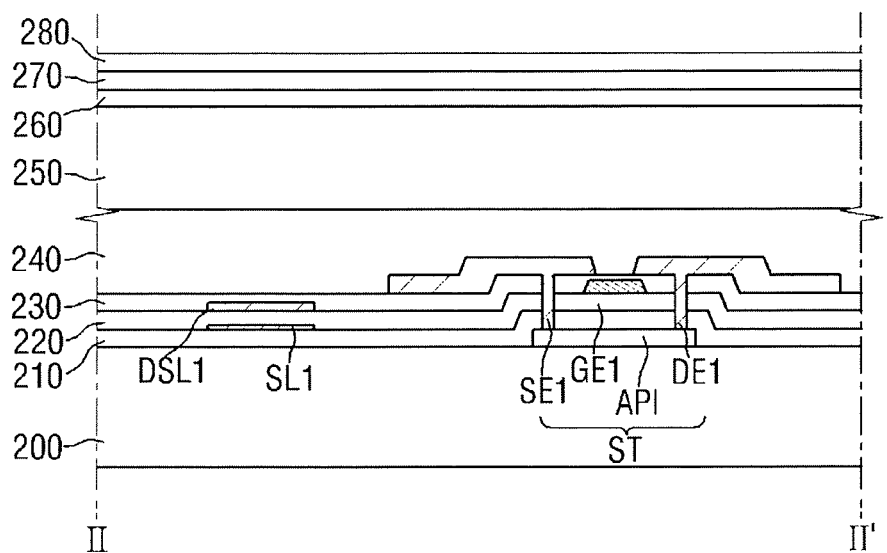
FIG. 13 is a cross-sectional view taken along line II-II' of FIG. 11.

FIG. 11 is a plan view of area A' of FIG. 3. FIG. 12 is a cross-sectional view taken along line I-I' of FIG. 11. FIG. 13 is a cross-sectional view taken along line II-II' of FIG. 11. In FIGS. 7 to 13, like reference numerals indicate like elements, and thus, detailed descriptions thereof will be omitted.

Referring to FIGS. 11 to 13, the gate electrode GE1 of the switching transistor ST is connected to the first child scan line DSL1. That is, the gate electrode GE1 of the switching transistor ST and the first child scan line DSL1 are formed in the same layer of the substrate, and the gate electrode GE1 of the switching transistor ST can receive the first scan signal S1 from the first child scan line DSL1. Accordingly, in the example of FIGS. 11 to 13, unlike in the example of FIGS. 7 to 10, the first parent scan line SL1 is a dummy scan line.

Accordingly, the first child scan line DSL1 is thicker than the first parent scan line SL1, and has a lower resistance than the first parent scan line SL1. In an exemplary embodiment, the thickness t2 of the first child scan line DSL1 may be about 9 KÅ, and the thickness t1 of the first parent scan line SL1 may be about 1 KÅ. That is, the first child scan line DSL1 to which the gate electrode GE1 of the switching transistor ST is electrically connected has a relatively low RC delay value. The first parent scan line SL1 and the first child scan line DSL1 are electrically connected to each other in the non-display area 10 via at least one contact hole B. That is, the first parent scan line SL1 and the first child scan line DSL1 are provided with a scan signal of the same voltage, i.e., the first scan signal S1, but the first child scan line DSL1 transmits the first scan signal S1 to the gate electrode GE1 of the switching transistor ST, not the first parent scan line SL1.

The first child scan line DSL1 is disposed above the gate electrode GE1 of the switching transistor ST. More specifically, the source and drain electrodes SE1 and DE1 are disposed above the gate electrode GE1, in which case, a parasitic capacitance can be generated between the gate electrode GE1 and the source and drain electrodes SE1 and DE1. Since the first child scan line DSL1 is disposed above the gate electrode GE1, and thus shields the gate electrode GE1, a parasitic capacitance can be generated between the gate electrode GE1 and the first child scan line DSL1. Since there is little voltage difference ΔV between a voltage applied to the first parent scan line SL1 and a voltage applied to the first child scan line DSL1, the total charge of the parasitic capacitance between the gate electrode GE1 and the first child scan line DSL1 decreases, and as a result, the parasitic capacitance between the gate electrode GE1 and the first child scan line DSL1 is less than the parasitic capacitance between the gate electrode GE1 and the source and drain electrodes SE1 and DE1.

Also, as described above, the first child scan line DSL1 to which the gate electrode GE1 of the switching transistor ST is connected has a relatively low resistance. Accordingly, an RC delay value, which is determined by the resistance R3 of the first child scan line DSL1, a parasitic component Cp1 between the gate electrode GE1 and the active layer AP1, and a parasitic component Cp3 between the gate electrode GE1 and the first child scan line DSL1, is reduced, thereby improving a signal delay phenomenon.

The first child scan line DSL1 has been described above as being disposed above the first parent scan line SL1 over the lower substrate 200, but embodiments of the disclosure are not limited thereto. That is, alternatively, the first parent scan line SL1 may be disposed above the first child scan line DSL1.

More specifically, in an alternative exemplary embodiment where the first parent scan line SL1 is disposed above the first child scan line DSL1, if the first parent scan line SL1 is formed in the same layer as the gate electrode GE1 of the switching transistor ST to provide the first scan signal S1 to the gate electrode GE1, the first child scan line DSL1 can shield a parasitic capacitance generated between the first parent scan line SL1 and the active layer AP1. The first parent scan line SL1 is thicker than the first child scan line DSL1, and thus has a lower resistance than the first child scan line DSL1. Accordingly, the first parent scan line SL1 has a lower RC value than the first child scan line DSL1, and the first parent scan line SL1 through which the switching transistor ST is provided with the first scan signal S1 has a relatively low RC delay value. As a result, a delay phenomenon may be improved.

On the other hand, in an alternative exemplary embodiment where the first parent scan line SL1 is disposed above the first child scan line DSL1, if the first child scan line DSL1 is formed in the same layer as the gate electrode GE1 of the switching transistor ST to provide the first scan signal S1 to the gate electrode GE1, the first parent scan line SL1 is thinner than the first child scan line DSL1, and thus has a higher resistance than the first child scan line DSL1. Accordingly, the first child scan line DSL1 has a lower RC value than the first parent scan line SL1, and the first child scan line SL1 through which the switching transistor ST is provided with the first scan signal S1 has a relatively low RC delay value. As a result, a delay phenomenon may be improved.

While embodiments of the present disclosure have been particularly shown and described with reference to exemplary embodiments thereof, it will be understood by those of ordinary skill in the art that various changes may be made therein without departing from the spirit and scope of the embodiments of the disclosure as defined by the following claims, and equivalents thereof. The-exemplary embodiments should be considered in a descriptive sense only and not for purposes of limitation.

What is claimed is:

1. An organic light-emitting display device, comprising; a substrate having a display area and a non-display area; a thin-film transistor (TFT) that includes a gate electrode and that is disposed in the display area of the substrate; a first scan line disposed in a same layer as the gate electrode that is connected to the gate electrode; and a second scan line disposed in a different layer from the first scan line and that overlaps the first scan line, wherein the first scan line is directly connected to the second scan line only at a branch point in the non-display area of the substrate.

2. The organic light-emitting display device of claim 1, wherein a thickness of the first scan line is greater than a thickness of the second scan line.

3. The organic light-emitting display device of claim 1, wherein the first scan line has a first end disposed in the non-display area and a second end disposed in the display area, and the second scan line is connected to the first end of the first scan line, but not to the second end of the first scan line.

4. The organic light-emitting display device of claim 1, wherein a resistive-capacitive (RC) delay value of the first scan line is less than an RC delay value of the second scan line.

5. The organic light-emitting display device of claim 1, wherein the TFT includes
an active layer disposed between the substrate and the gate electrode, and
source and drain electrodes disposed above the gate electrode and that are connected to the active layer.

6. The organic light-emitting display device of claim 5, wherein the second scan line is disposed between the first scan line and the source and drain electrodes and shields a parasitic capacitance between the first scan line and the source and drain electrodes.

7. The organic light-emitting display device of claim 5, wherein the second scan line is disposed between the first scan line and the active layer and shields a parasitic capacitance between the first scan line and the active layer.

8. The organic light-emitting display device of claim 5, further comprising:
a storage capacitor that includes a lower electrode disposed on the substrate, and an upper electrode disposed on the lower electrode,
wherein the lower and upper electrodes overlap each other.

9. An organic light-emitting display device, comprising;
a substrate having a display area and a non-display area;
a thin-film transistor (TFT) disposed on the substrate that includes a gate electrode;
a first scan line disposed in a same layer as the gate electrode that provides a scan signal to the gate electrode;
a second scan line disposed along the same direction as the first scan line in a different layer from the first scan line and that overlaps the first scan line; and
wherein the first and second scan lines are provided with a same voltage and the first scan line is directly connected to the second scan line only at a branch point in the non-display area of the substrate.

10. The organic light-emitting display device of claim 9, wherein the substrate includes a display area in which the TFT is disposed, and a non-display area which surrounds the display area, and the first scan line is connected to the second scan line in the non-display area via at least one contact hole.

11. The organic light-emitting display device of claim 9, wherein the first and second scan lines are disposed parallel to each other.

12. The organic light-emitting display device of claim 9, wherein a thickness of the first scan line is greater than a thickness of the second scan line.

13. The organic light-emitting display device of claim 9, wherein a resistive-capacitive (RC) delay value of the first scan line is less than an RC delay value of the second scan line.

14. The organic light-emitting display device of claim 9, wherein the TFT includes;
an active layer disposed between the substrate and the gate electrode; and
source and drain electrodes disposed above the gate electrode and that are connected to the active layer.

15. The organic light-emitting display device of claim 14, wherein the second scan line is disposed above the first scan line and shields a parasitic capacitance between the first scan line and the source and drain electrodes.

16. The organic light-emitting display device of claim 14, wherein the second scan line is disposed below the first scan line and shields a parasitic capacitance between the first scan line and the active layer.

17. An organic light-emitting display device, comprising:
a data line disposed along a first direction;
a first scan line disposed in a second direction that crosses the first direction and that has a branch point;
a second scan line disposed along the second direction that is directly connected to the branch point; and
a display panel that includes a pixel unit connected to the first scan line and the data line,
wherein an RC delay value of the first scan line is less than an RC delay value of the second scan line.

18. The organic light-emitting display device of claim 17, wherein the pixel unit includes:
a switching transistor that includes a first electrode connected to the data line and a gate electrode connected to the first scan line;
a driving transistor that includes a first electrode connected to a driving voltage terminal and a gate electrode connected to a second electrode of the switching transistor;
a storage capacitor connected between the gate electrode and the first electrode of the driving transistor; and
an organic light-emitting element connected to a second electrode of the driving transistor.

19. The organic light-emitting display device of claim 17, further comprising:
a scan driving unit that provides a first scan signal to the pixel unit via the first scan line; and
a data driving unit that provides a data signal to the pixel unit via the data line.

20. The organic light-emitting display device of claim 17, wherein the second scan line is directly connected to the first scan line only at the branch point, and is insulated from the first scan line.

* * * * *